United States Patent
Wong et al.

(10) Patent No.: US 7,135,767 B2
(45) Date of Patent: Nov. 14, 2006

(54) INTEGRATED CIRCUIT SUBSTRATE MATERIAL AND METHOD

(75) Inventors: Marvin Glenn Wong, Woodland Park, CO (US); Arthur Fong, Colorado Springs, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 79 days.

(21) Appl. No.: 10/629,271

(22) Filed: Jul. 29, 2003

(65) Prior Publication Data
US 2005/0022905 A1 Feb. 3, 2005

(51) Int. Cl.
*H01L 23/08* (2006.01)
*B32B 18/00* (2006.01)

(52) U.S. Cl. ...................... 257/701; 428/406
(58) Field of Classification Search .................. 148/33; 438/510, 710; 257/701, 702; 428/404, 405, 428/406; 427/96.1
See application file for complete search history.

(56) References Cited

U.S. PATENT DOCUMENTS

| | | | | |
|---|---|---|---|---|
| 3,256,105 | A * | 6/1966 | Alford et al. ................. 501/80 |
| 4,621,024 | A * | 11/1986 | Wright ......................... 428/404 |
| RE34,887 | E * | 3/1995 | Ushifusa et al. ............ 361/795 |
| 5,691,059 | A * | 11/1997 | Moh ............................. 428/404 |
| 6,036,798 | A | 3/2000 | Nishide et al. |
| 6,110,649 | A * | 8/2000 | Carter et al. ................. 430/313 |
| 6,210,715 | B1 * | 4/2001 | Starling et al. .............. 424/489 |
| 2001/0029974 | A1 * | 10/2001 | Cohen et al. ................. 136/201 |
| 2002/0090514 | A1 * | 7/2002 | Leroux et al. ............... 428/406 |
| 2003/0047718 | A1 * | 3/2003 | Narayan et al. ............. 252/500 |

FOREIGN PATENT DOCUMENTS

JP 2003017481 A * 1/2003

OTHER PUBLICATIONS

Bae et al. Derwent Abstracted Publication No. KR2002007774A "Ceramic hollow microsphere production" Jul. 22, 2003.*
Lodel Nitt KK Derwent Abstracted Publication No. JP2003017481A "Low dielectric constant insulating film material for semiconductor device, includes hollow microsphere element".*
Chellis, et al. "Flame retardant. low electric constant, low cost prepreg material" Derwent Abstracted Publication No. EP 440918A, Aug. 14, 1991.*
3M Specialty Additives—Home page, http://www.3m.com/microspheres/content.html, printed as of Jul. 22, 2003.

* cited by examiner

*Primary Examiner*—Carl Whitehead, Jr.
*Assistant Examiner*—Jennifer M Dolan (57) ABSTRACT

A semiconductor substrate is presented which is manufactured from hollow, gas-filled glass or ceramic microspheres, which are bound together in a dried or fired matrix. The microspheres may be glass-coated microspheres, which are bound together by sintering the outer layers of glass together. The semiconductor surface may be smoothed by glazing the surface.

9 Claims, 13 Drawing Sheets

INTEGRATED CIRCUIT SUBSTRATE MATERIAL AND METHOD

BACKGROUND OF THE INVENTION

Electronic components, such as integrated circuits are becoming more and more common in various devices. Under certain circumstances, it is important for the integrated circuit substrate to have various qualities or attributes. Often certain qualities are balanced against other qualities. It is sometimes important for the substrate to have low thermal conductivity, low mass, low cost, low dielectric constant, high strength, etc. Depending upon the application, some of these qualities may be less important than others and the design team makes trade-offs to maximize the desired qualities with the minimum weaknesses and costs.

Accordingly, there exists a need in the industry for materials that can be used for integrated circuit substrates that meet the different electrical and physical requirements of current electronics.

SUMMARY OF THE INVENTION

An apparatus and method for manufacturing a semiconductor substrate of hollow microspheres is presented. The apparatus may comprise gas-filled ceramic or glass microspheres that are bound together in a matrix by drying, heating or firing the matrix. The apparatus may comprise glass-coated glass or ceramic microspheres that are bound together by sintering the outer layer of glass at a temperature that does not melt the glass or ceramic microspheres. The apparatus may also comprise a glazed surface.

A method for manufacturing a semiconductor substrate of hollow microspheres is presented. A method for manufacturing a semiconductor substrate is presented, which may include combining hollow microspheres with a matrix, drying the matrix of microspheres, and forming the matrix of microspheres into a semiconductor substrate. The method for manufacturing a semiconductor substrate as presented may also include glazing a surface.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION

As shown in the drawings for purposes of illustration, the present invention relates to techniques for manufacturing a integrated circuit substrate using ceramic, glass or glass-coated ceramic, hollow microspheres to create a substrate having low thermal conductivity, low dielectric constant, low electrical conductivity, light weight and high strength.

Figure 1:
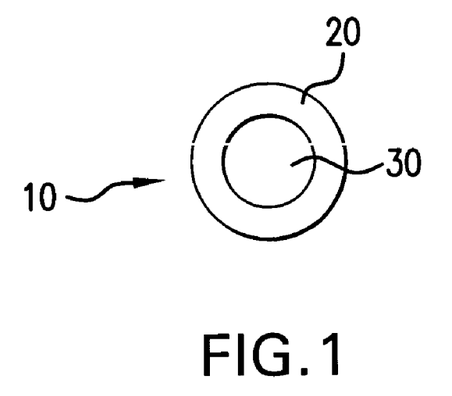
FIG. 1 illustrates a cross-sectional of a hollow microsphere in accordance with an embodiment of the present invention.

Turning now to the drawings, FIG. 1 illustrates a cross-section of a hollow microsphere 10. The hollow microsphere 10 may be made of ceramic or glass 20 and may have a hollow, gas filled interior, such as any glass or ceramic microsphere manufactured by 3M under the trade name microsphere, Zeeospheres, Scotchlite glass bubbles, or other known glass or ceramic, hollow microsphere of silica-alumina ceramic, alkali alumina silicate, soda-lime-borosilicate, or other similar substance. The microspheres may be of 1.0–225 micron in size, with a 200–1040° C. melting temperature and externally coated with binding materials to allow microsphere matrix wafer formation.

Figure 2:
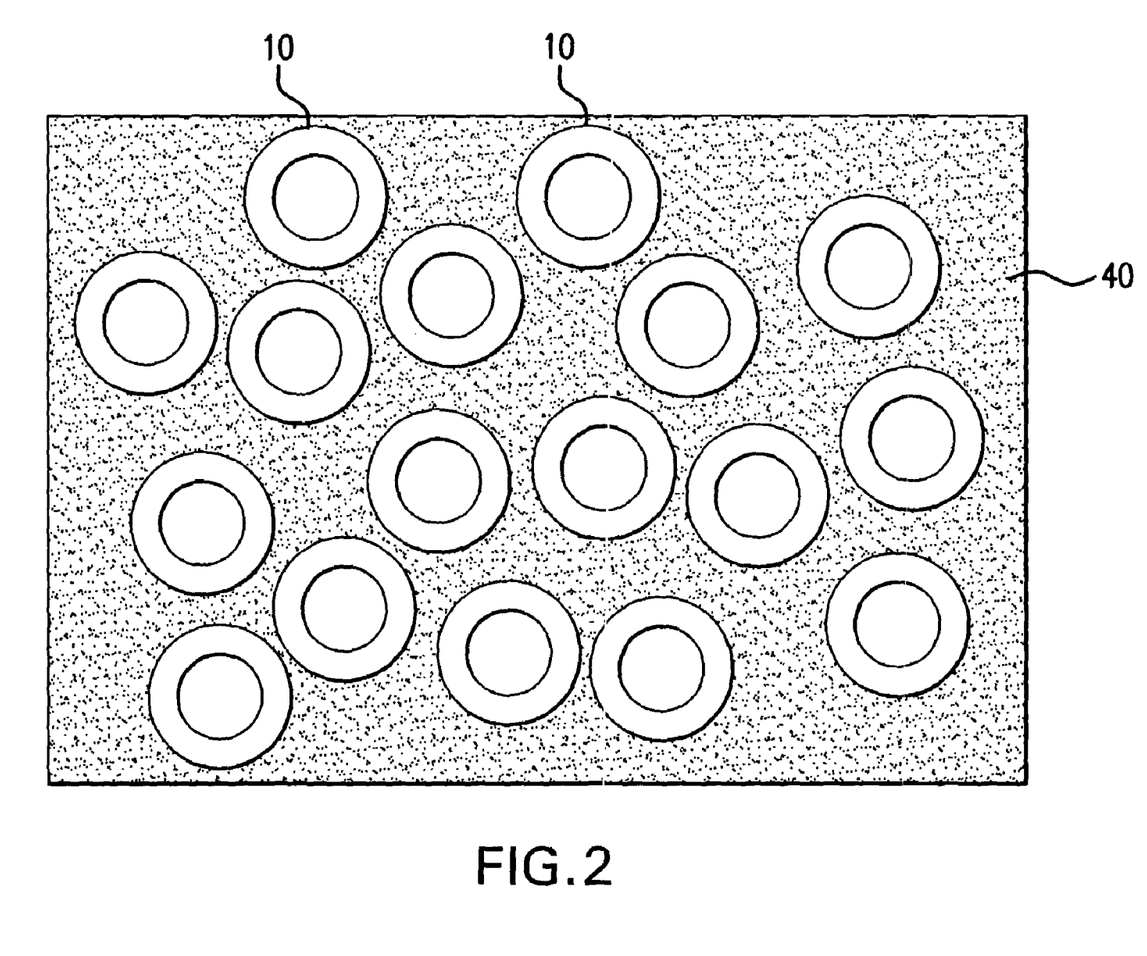
FIG. 2 illustrates a cross-sectional of a slurry of hollow microspheres in accordance with an embodiment of the present invention.

FIG. 2 shows microspheres 10 in a slurry matrix 40 composed of an appropriate vehicle for the desired substrate applications. For example, slurry matrix 40 may be composed of glass particles; binders, such as ethyl cellulose, acrylics, polyvinyl alcohols, organic polymers; solvents, such as water, acetone, polyglycols; viscosity modifiers, such as surfactants, organic thickeners or other fillers as required to accomplish the desired substrate characteristics for thermal conductivity, dielectric constant, mass, strength, cost of materials and manufacture, etc.

Figure 3:
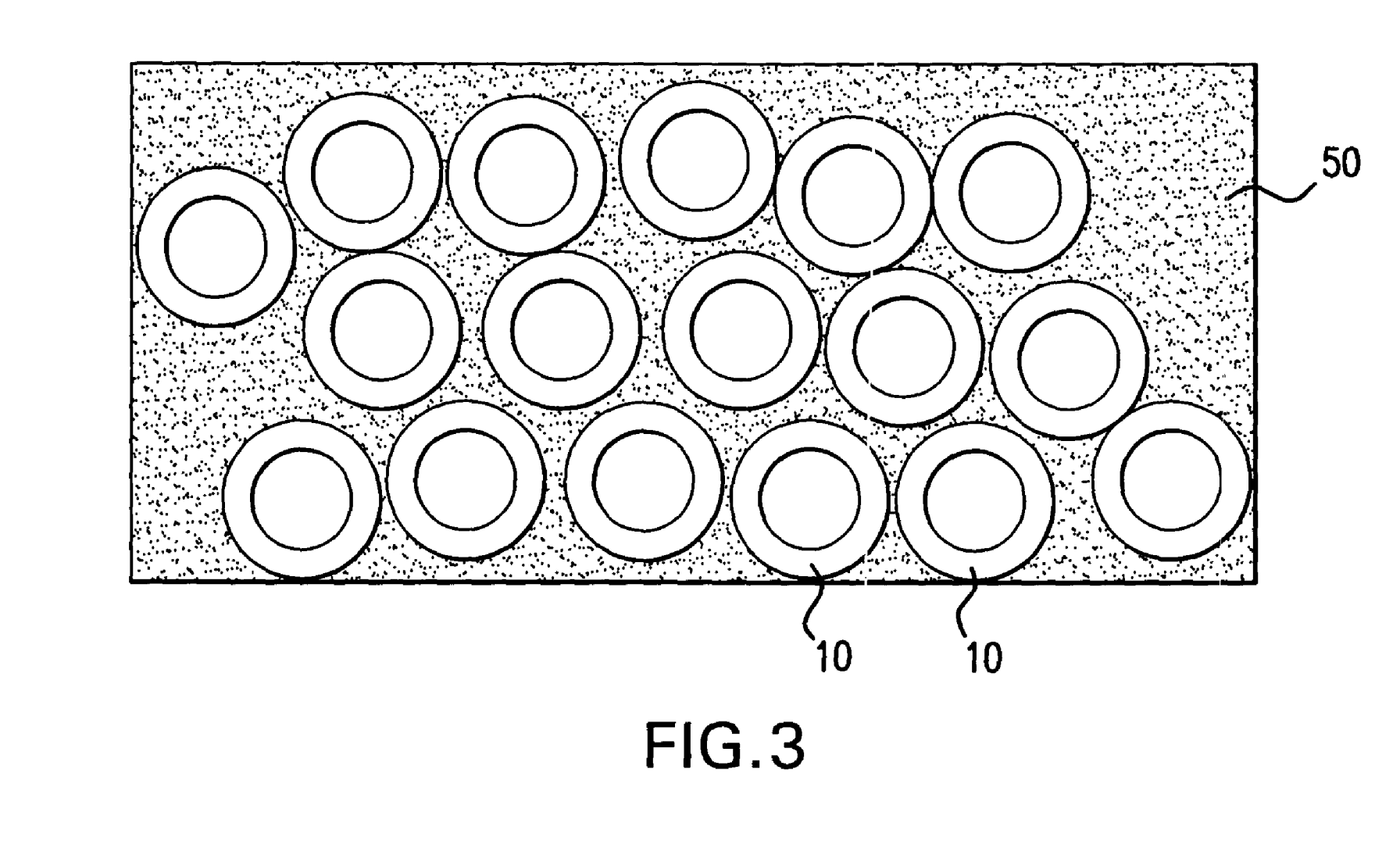
FIG. 3 illustrates a cross-sectional of a hardened matrix of hollow microspheres in accordance with an embodiment of the present invention.
Figure 4:
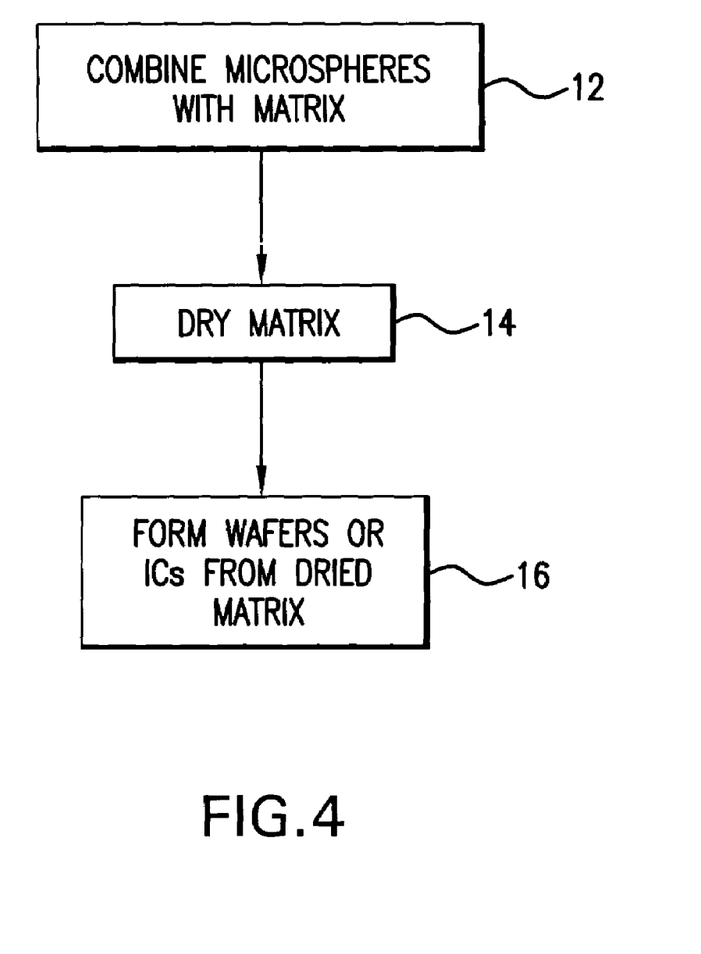
FIG. 4 illustrates a flow chart for manufacturing a substrate in accordance with the embodiment of FIG. 3 of the present invention.

FIG. 3 shows microspheres 10 in a dried or cured slurry matrix 50. As is readily apparent in FIG. 3, the microspheres 10 have a random arrangement in the dried or cured slurry matrix 50. FIG. 4 is a flow chart of a possible method to manufacture a substrate according to FIGS. 1–3, in which microspheres 10 are combined 12 with an appropriate matrix 40, dried or cured 14 until the slurry matrix 40 hardens, and formed 16 into semiconductor wafers or integrated circuit die 50. The slurry matrix 40 may be dried or cured by heat, x-ray, high-energy radiation, electron beam, microwave or by any other known drying or curing method. The slurry matrix may be formed into wafers or die either before or after the slurry matrix 40 is dried or cured. The slurry matrix 40 may be formed into wafers or die by means of die cutting, stamping, powder pressing, lamination, etc. It should be noted that the matrix of microspheres may be formed into wafers of integrated circuit substrates prior to the drying step, in which case the forming would be by means of doctor blade casting, mold casting, etc.

Figure 5:
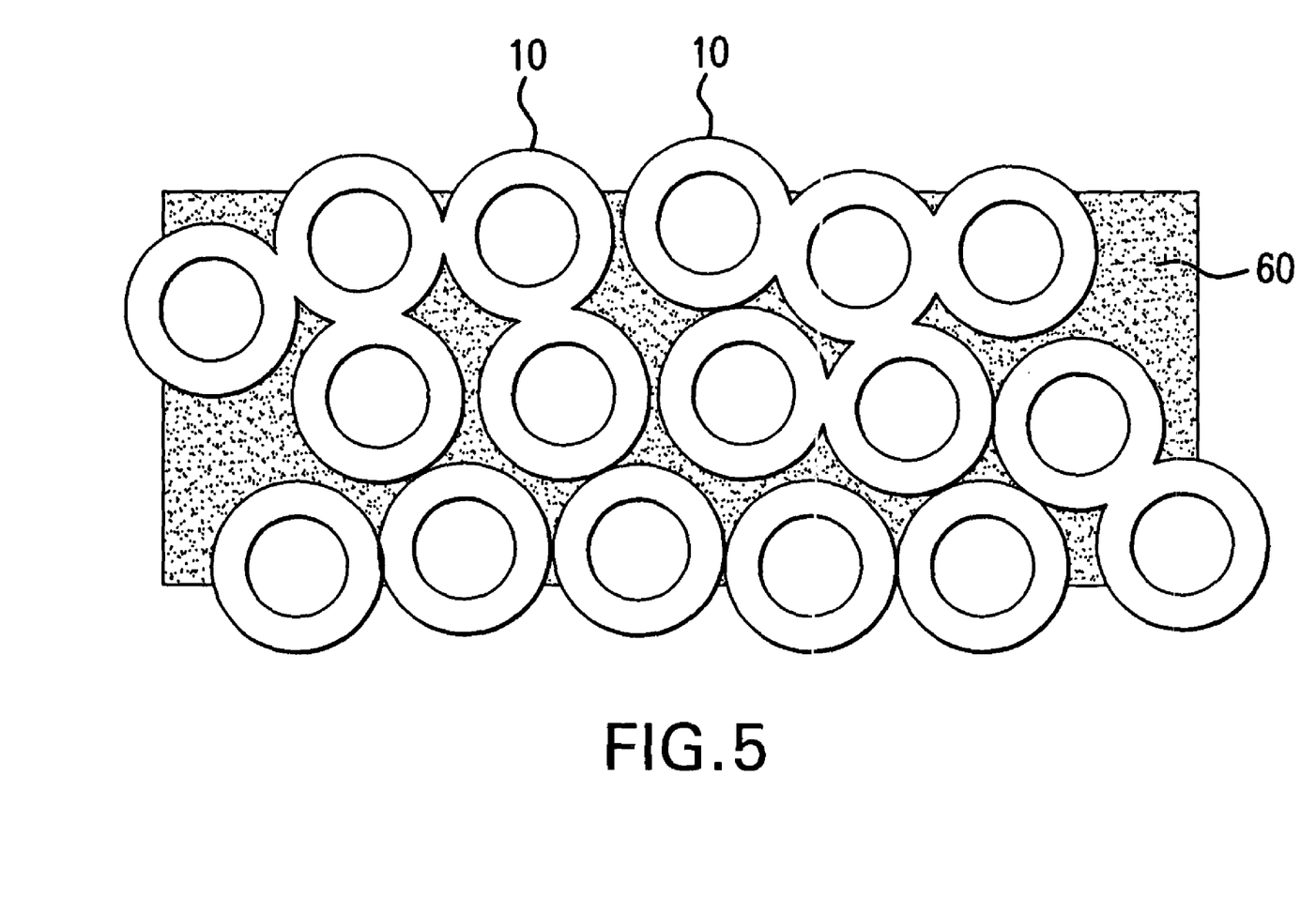
FIG. 5 illustrates a cross-sectional of a fired matrix of hollow microspheres in accordance with an embodiment of the present invention.
Figure 6:
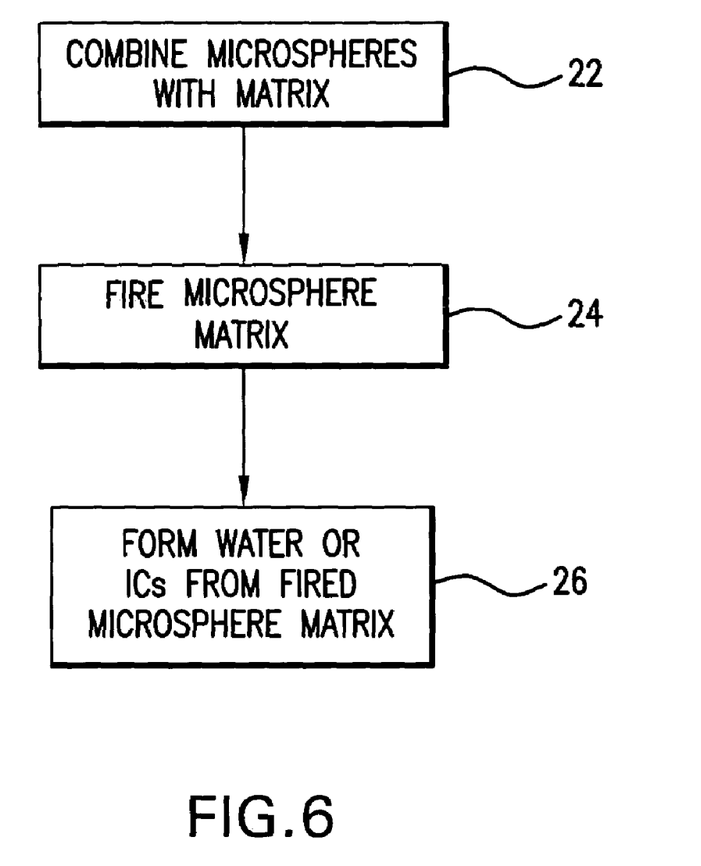
FIG. 6 illustrates a flow chart for manufacturing a substrate in accordance with the embodiment of FIG. 5 of the present invention.

FIG. 5 shows fired slurry matrix 60 with hollow microspheres 10. As shown in FIG. 6, this method would include combining 22 the microspheres 10 with the matrix 60, firing 24 the slurry matrix and forming 26 wafers or integrated circuit substrates of the matrix 60 containing microspheres 10. This process may more particularly comprise ball milling or spraying to mix the microsphere matrix raw materials 22, firing the microsphere matrix to sinter materials and laser cutting, saw cutting, grinding, etc. to form the final wafer form.

Figure 7:
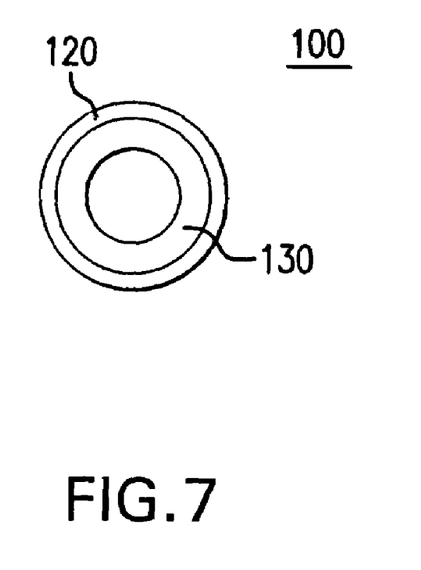
FIG. 7 illustrates a cross-sectional view of a glass-coated, hollow microsphere in accordance with another embodiment of the present invention.

FIG. 7 show a cross-sectional view of a glass coated microsphere 100 according to another embodiment of the present invention. The microsphere 100 may include a high temperature glass or ceramic hollow microsphere 120 that is coated with a low temperature glass 130. The inner microsphere 120 may be any hollow, gas filled interior, such as any glass or ceramic microsphere manufactured by 3M under the trade name microsphere, Zeeospheres, Scotchlite glass bubbles, or other known glass or ceramic, hollow microsphere of silica-alumina ceramic, alkali alumina silicate, soda-lime-borosilicate or other similar substance. The outer low temperature glass coating 130 may be made by spray coating, slurry coating, vapor deposition, etc. The composition of the inner microsphere 120 and the other glass coating 130 may be selected such that the outer glass coating 130 has a lower melting temperature than the inner microsphere 120. By way of example only, the glass-coated microspheres may be made of a microsphere of approximately 10–250 microns in size with 500–1040° C. melting temperature and have an outer layer of glass of 1.0–10.0 microns in thickness with a 200–330° C. melting temperature.

Figure 8:
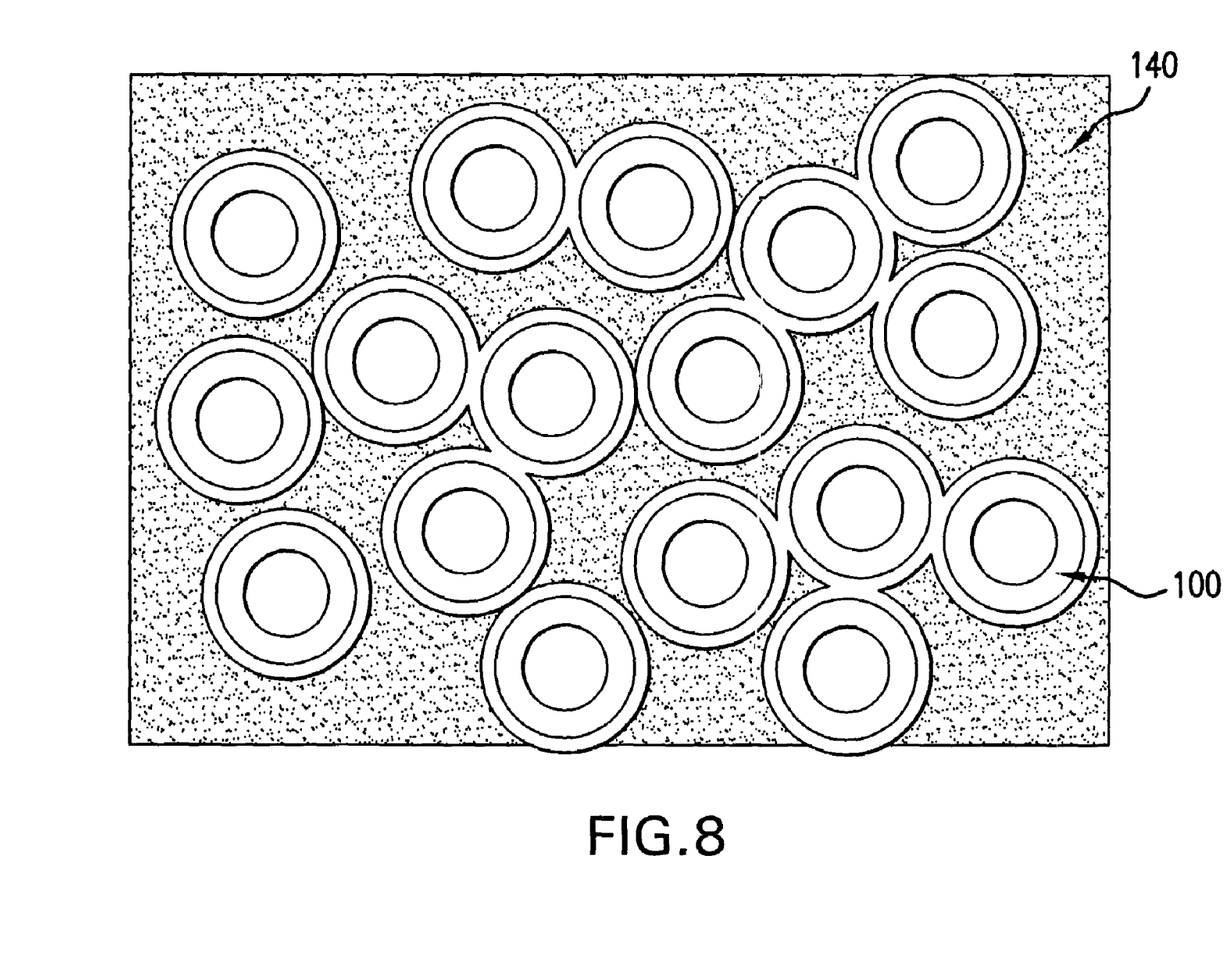
FIG. 8 illustrates a cross-sectional view of a slurry of glass-coated, hollow microspheres in accordance with another embodiment of the present invention.

FIG. 8 shows a cross-sectional view of glass-coated microspheres 100 in a slurry matrix 140 composed of an appropriate vehicle for the desired substrate applications. For example, slurry matrix 140 may be composed of glass particles; binders, such as borophosphate glass and polyvinyl alcohol binder; solvents, such as water; viscosity modifiers, such as liquid surfactants or magnesium silicates thickening agents or other fillers as required to accomplish the desired substrate characteristics for thermal conductivity, dielectric constant, mass, strength, cost of materials and manufacture, etc.

Figure 9:
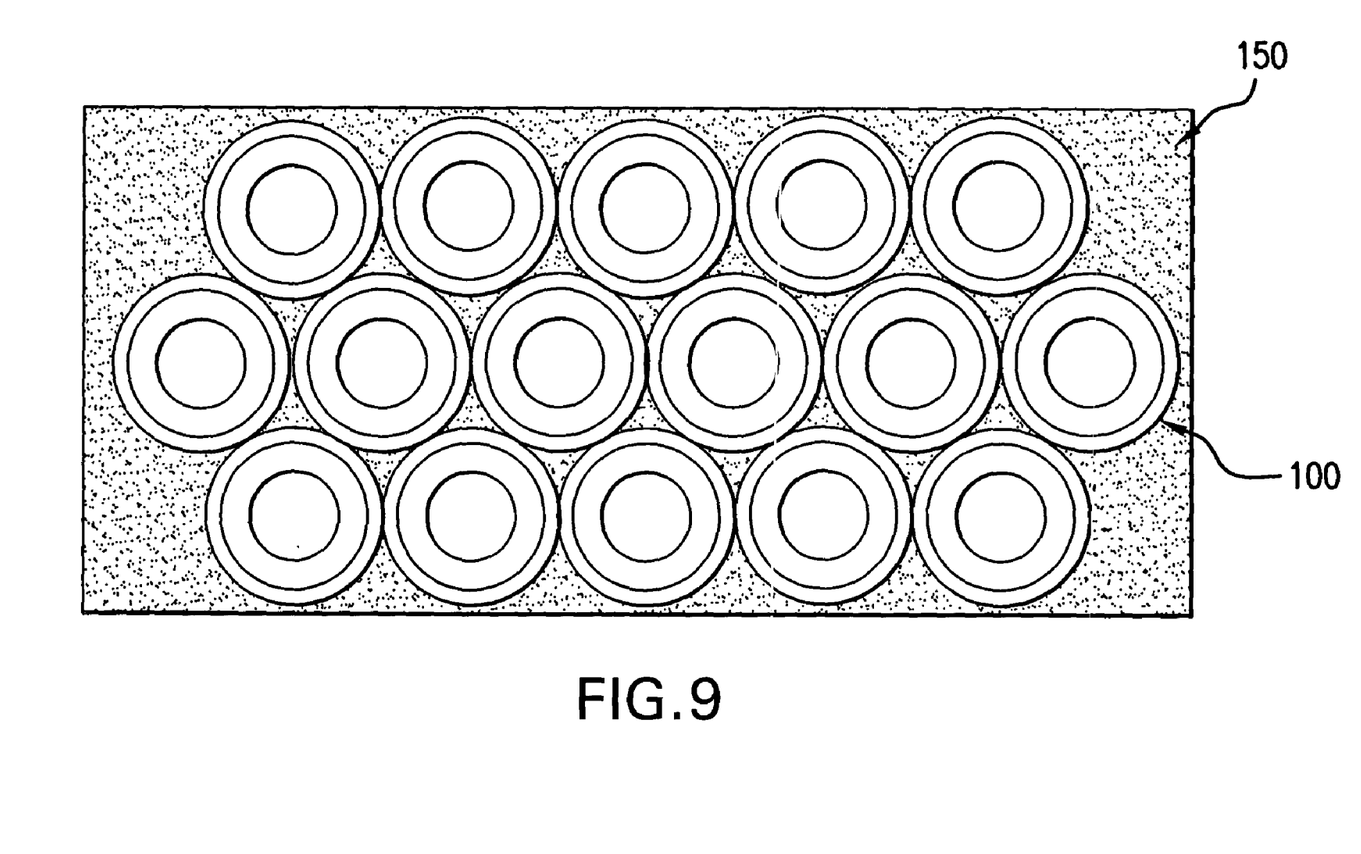
FIG. 9 illustrates a cross-sectional view of a dried matrix of glass-coated, hollow microspheres in accordance with another embodiment of the present invention.
Figure 10:
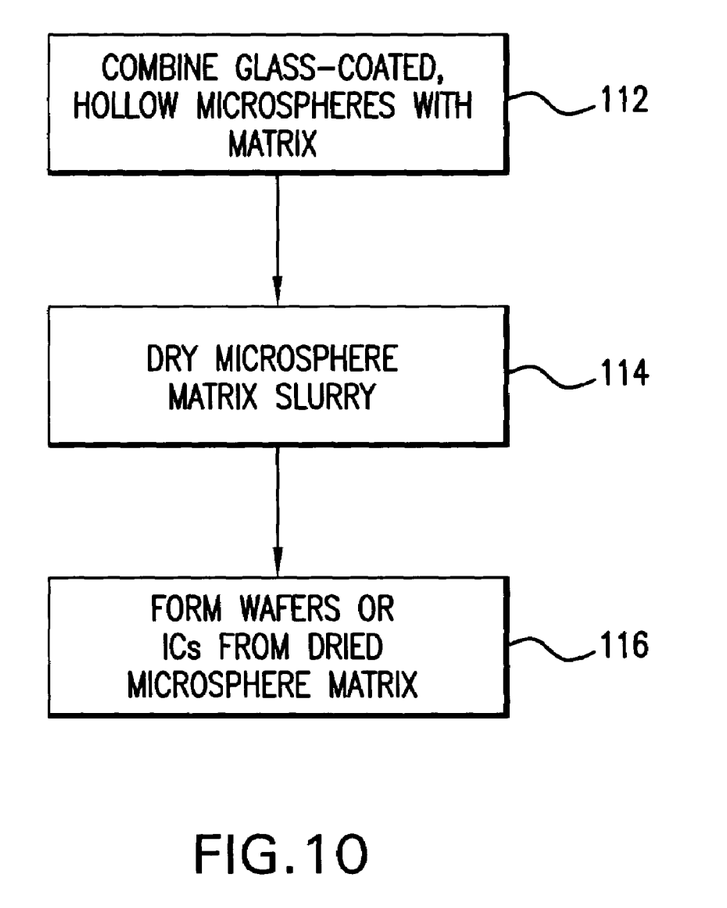
FIG. 10 illustrates a flow chart for manufacturing a substrate in accordance with the embodiment of FIG. 9 of the present invention.

FIG. 9 shows a cross-sectional view of glass-coated microspheres 100 in a dried or cured slurry matrix 150. As is readily apparent in FIG. 9, the glass-coated microspheres 100 have a random arrangement in the dried or cured slurry matrix 150. FIG. 10 is a flow chart of a possible method to manufacture a substrate according to FIGS. 7–9, in which glass-coated microspheres 100 are combined 112 with an appropriate matrix 140, dried or cured 114 until the slurry matrix 140 hardens, and formed 116 into semiconductor wafers or integrated circuit die 150. The slurry matrix 140 may be dried or cured by heat, x-ray, high-energy radiation, microwave, ultraviolet, radiation or by any other known drying or curing method. The slurry matrix 140 may be formed into wafers, integrated circuit substrates or die either before or after the slurry matrix 140 is dried or cured. The slurry matrix 140 may be formed into wafers or die by means of die cutting, stamping, cutting, etc. It should be noted that the matrix of glass-coated microspheres may be formed into wafers or integrated circuit substrates prior to the drying step, in which case the forming would be by means of knife coating (tape casting), mold casting, calendaring, etc.

Figure 11:
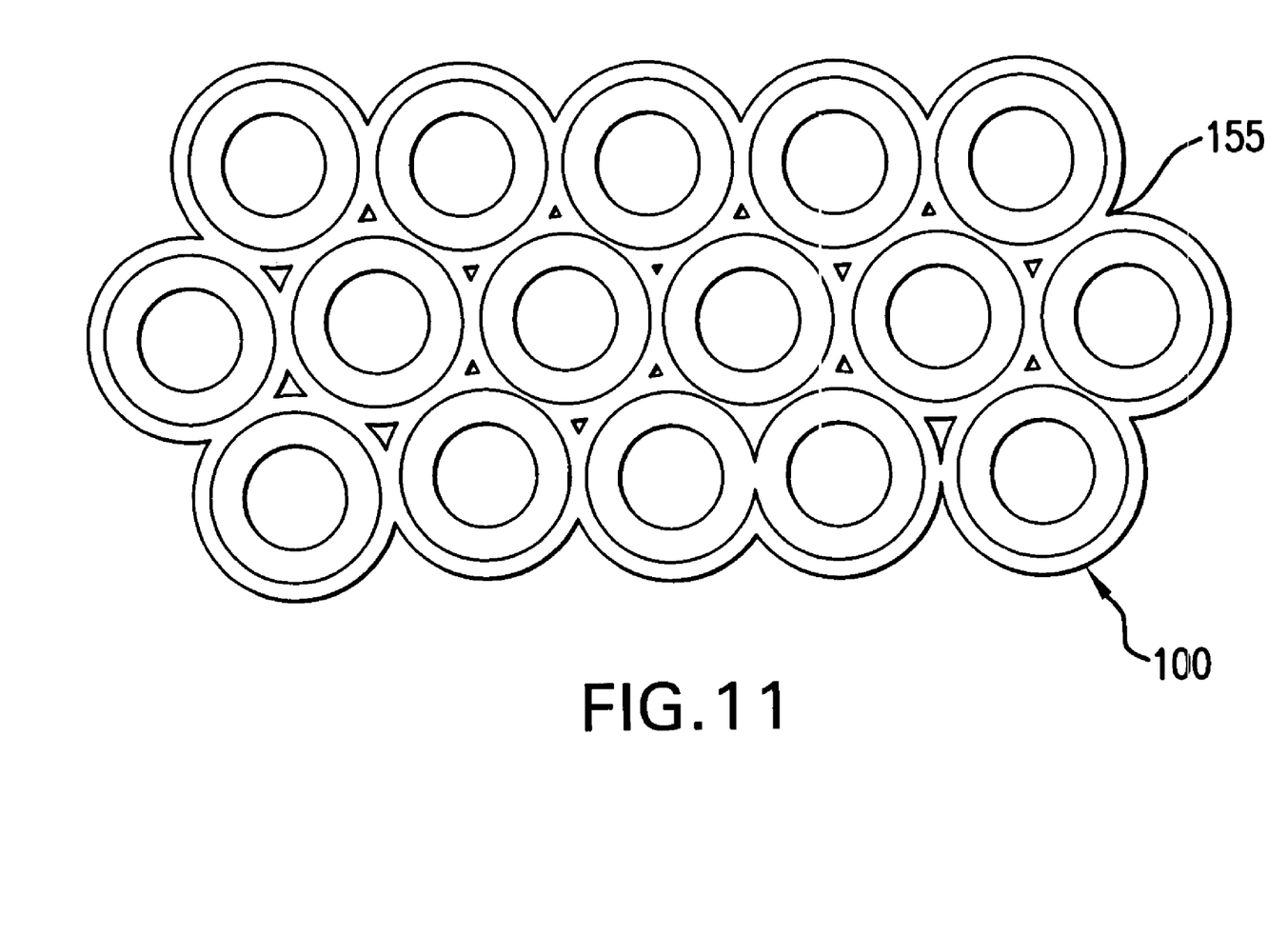
FIG. 11 illustrates a cross-sectional view of a fired matrix of glass-coated, hollow microspheres in accordance with another embodiment of the present invention.
Figure 12:
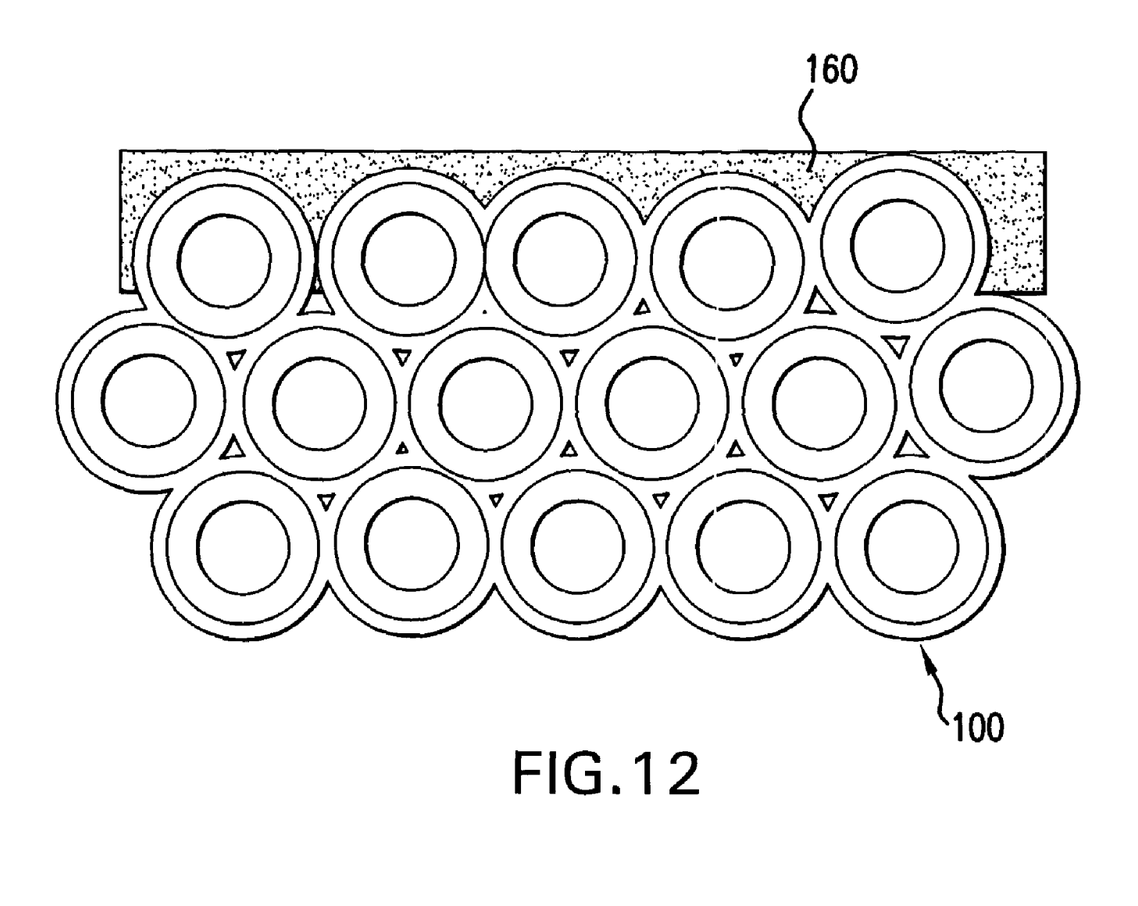
FIG. 12 illustrates a cross-sectional view of a glazed surface of a fired matrix of glass-coated, hollow microspheres in accordance with another embodiment of the present invention.
Figure 13:
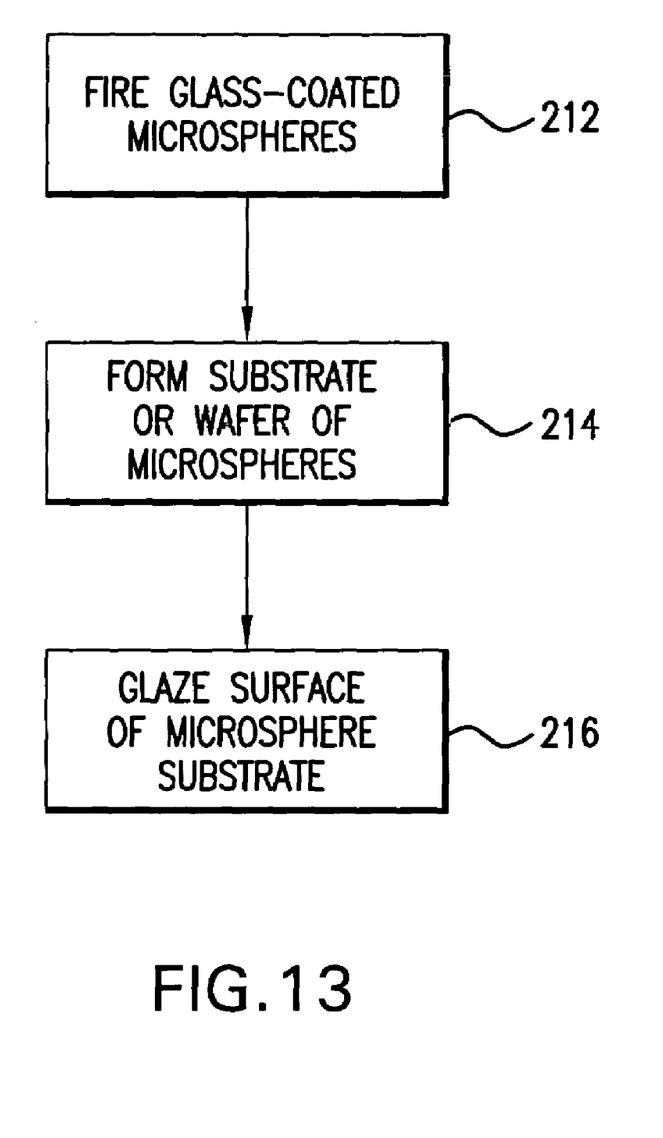
FIG. 13 illustrates a flow chart for manufacturing a substrate in accordance with the embodiments of FIG. 5, 11 or 12 of the present invention.

FIG. 11 shows cross-sectional view of fired glass-coated microspheres 100. As shown in FIGS. 11–13, this method would include firing 212 the glass-coated microspheres 100 and forming 214 wafers or integrated circuit substrates of the glass-coated microspheres 100. The firing or sintering step 212 should be at a temperature such that the outer glass-coating 130 of the glass-coated microspheres melts and the microspheres 100 become sintered or glued together 155. The firing or sintering temperature should not be high enough to melt the inner glass or ceramic microspheres 120.

Thus, the outer glass coating material 130 should be selected from any of several materials such as, borophosphate glass, borosilicate glass, etc., such that it has a relatively low melting point. And the inner microsphere 120 should be selected from any known microsphere with a higher melting point than the outer glass coating material, such that when the outer glass coating is sintered, the inner microsphere does not melt, but the outer glass coatings of the microspheres essentially binds, sinters or glues the microspheres together. This process may optionally include glazing 216 of a top surface 160 of the wafer or integrated circuit substrate in order to smooth the surface of the substrate of sintered glass-coated microspheres 100. The glazing process may include screen printing thick film glass 160, spin coating glass, vapor deposition, etc.

The present invention may create a semiconductor substrate having applications where there are requirements for high strength of ceramic; lightweight substrate; low dielectric-constant substrate, (such as in high frequency circuit applications, a need for less capacitive coupling, low loss of signal propagation or microwave applications); or applications requiring low thermal conductivity.

Although this preferred embodiment of the present invention has been disclosed for illustrative purposes, those skilled in the art will appreciate that various modifications, additions and substitutions are possible, without departing from the scope of the invention, resulting in equivalent embodiments that remain within the scope of the appended claims.

What is claimed is:

1. A semiconductor substrate material for producing a semiconductor substrate, the semiconductor substrate material comprising:

a multitude of hollow microspheres, each one of the multitude of hollow microspheres having an inner layer and an outer layer, the inner layer comprising a first material, the outer layer comprising a second material, and the first material and the second material differing from one another, wherein the multitude of hollow microspheres comprises a multitude of gas filled ceramic microspheres, wherein the second material of the outer layer comprises a glass material, the inner layer of each of the gas filled ceramic microspheres has a first melting point, the outer layer of the glass material has a second melting point, and the first melting point is higher than the second melting point.

2. The semiconductor substrate material in accordance with claim 1, wherein the outer layer of glass material of one of the multitude of gas filled ceramic microspheres is sintered to the outer layer of glass material of another one of the multitude of gas filled ceramic microspheres.

3. The semiconductor substrate material in accordance with claim 1, wherein a hardened matrix contains the gas filled ceramic microspheres.

4. The semiconductor substrate material in accordance with claim 3, wherein the hardened matrix containing the multitude of hollow microspheres comprises glass particles, a binder material, and a viscosity modifier.

5. The semiconductor substrate material in accordance with claim 4, wherein the binder material comprises at least one chosen from the group consisting of ethyl cellulose, an acrylic, a polyvinyl alcohol, an organic polymer, and a borophosphate glass.

6. The semiconductor substrate material in accordance with claim 4, wherein the at least one viscosity modifier comprises at least one chosen from the group consisting of a surfactant, an organic thickener, a magnesium silicates thickening agent, and a filler material.

7. The semiconductor substrate material in accordance with claim 1, wherein a glaze is disposed on a top surface of the semiconductor.

8. The semiconductor substrate material in accordance with claim 1, wherein the semiconductor substrate forms a semiconductor wafer.

9. The semiconductor substrate material in accordance with claim 1, wherein the semiconductor substrate forms an integrated circuit die.

* * * * *

UNITED STATES PATENT AND TRADEMARK OFFICE
CERTIFICATE OF CORRECTION

PATENT NO. : 7,135,767 B2  Page 1 of 1
APPLICATION NO. : 10/629271
DATED : November 14, 2006
INVENTOR(S) : Wong et al.

It is certified that error appears in the above-identified patent and that said Letters Patent is hereby corrected as shown below:

In column 6, line 6, in Claim 7, after "semiconductor" insert -- substrate --.

Signed and Sealed this

Twentieth Day of March, 2007

JON W. DUDAS
*Director of the United States Patent and Trademark Office*